United States Patent
Suwa

(10) Patent No.: US 7,679,363 B2
(45) Date of Patent: Mar. 16, 2010

(54) MAGNETIC RESONANCE IMAGING APPARATUS AND METHOD OF EXCITING TWO SLICES INTERSECTING EACH OTHER WITH THE INTERSECTION PARALLEL MOVED DURING SPIN ECHO RECEPTION

(75) Inventor: Yuko Suwa, Tokyo (JP)

(73) Assignee: GE Medical Systems Global Technology Company, LLC, Waukesha, WI (US)

( * ) Notice: Subject to any disclaimer, the term of this patent is extended or adjusted under 35 U.S.C. 154(b) by 301 days.

(21) Appl. No.: 11/769,382

(22) Filed: Jun. 27, 2007

(65) Prior Publication Data

US 2008/0001604 A1 Jan. 3, 2008

(30) Foreign Application Priority Data

Jun. 30, 2006 (JP) ............................. 2006-181007

(51) Int. Cl.
*G01V 3/00* (2006.01)
(52) U.S. Cl. .................. 324/307; 324/318; 324/309
(58) Field of Classification Search ......... 324/300–322; 424/407–435; 382/128–131
See application file for complete search history.

(56) References Cited

U.S. PATENT DOCUMENTS

| | | | |
|---|---|---|---|
| 4,746,863 A | 5/1988 | Crooks et al. | |
| 5,833,609 A | 11/1998 | Dannels et al. | |
| 6,208,139 B1 * | 3/2001 | Foo et al. | 324/309 |
| 6,320,378 B1 * | 11/2001 | Maier et al. | 324/307 |
| 6,628,116 B1 * | 9/2003 | Kraft et al. | 324/307 |
| 7,245,124 B2 * | 7/2007 | Shu et al. | 324/307 |
| 7,245,125 B2 * | 7/2007 | Harer et al. | 324/310 |
| 7,429,862 B2 * | 9/2008 | Kholmovski et al. | 324/310 |
| 7,479,782 B2 * | 1/2009 | Van Den Brink | 324/307 |
| 7,492,152 B2 * | 2/2009 | Yun et al. | 324/307 |
| 7,535,222 B2 * | 5/2009 | Bammer et al. | 324/307 |
| 2007/0116340 A1 * | 5/2007 | Beyrard | 382/128 |
| 2008/0001604 A1 * | 1/2008 | Suwa | 324/318 |

FOREIGN PATENT DOCUMENTS

JP 2001-061810 3/2001

* cited by examiner

*Primary Examiner*—Brij B. Shrivastav
*Assistant Examiner*—Tiffany A Fetzner
(74) *Attorney, Agent, or Firm*—Armstrong Teasdale LLP

(57) ABSTRACT

With the objective of eliminating variations in signal strength, there is provided a magnetic resonance imaging apparatus in which the process of 90°-exciting and 180°-exciting spins of two slices intersecting each other respectively and receiving a spin echo generated from an intersection thereof is repeated while the intersection is sequentially parallel-moved to a plurality of lines, thereby to generate, based on the received spin echo, a two-dimensional image at the time that the plural lines are seen in a projection direction. In the magnetic resonance imaging apparatus, the lines are set at a matrix in which a phase direction is defined as a row direction and the projection direction is defined as a column direction. A plurality of the lines at which a predetermined number of column intervals are defined as mutual intervals are set in the respective rows. One line is set to each column. The numbers of the lines in the respective rows are common divisors for the number of the columns in the matrix and set identical to one another between the respective rows.

20 Claims, 6 Drawing Sheets

MAGNETIC RESONANCE IMAGING APPARATUS AND METHOD OF EXCITING TWO SLICES INTERSECTING EACH OTHER WITH THE INTERSECTION PARALLEL MOVED DURING SPIN ECHO RECEPTION

CROSS REFERENCE TO RELATED APPLICATIONS

This application claims the benefit of Japanese Application No. 2006-181007 filed Jun. 30, 2006.

BACKGROUND OF THE INVENTION

The present invention relates to a magnetic resonance imaging apparatus, a magnetic resonance receiving apparatus, and a magnetic resonance imaging method.

A method called a line scan has been disclosed in a patent document 1. FIG. 3 is a conceptual diagram for describing a line scan. In the line scan, the operation of 90°-exciting and 180°-exciting spins of two slices S1 and S2 intersecting each other respectively and thereby receiving a spin echo generated from an intersection IT thereof, and subjecting the received spin echo to one-dimensional inverse Fourier transformation to obtain line images at the intersection is repeated while the intersection IT is parallel-moved in a phase direction Dph or the like within an imaging space. By collecting those line images, a two-dimensional image of a subject as seen in a projection direction Dpr is constructed.

[Patent Document 1] Japanese Unexamined Patent Publication No. 2001-61810

In the patent document 1, one two-dimensional image is obtained by moving the intersection IT placed on one plane. In contrast, it is considered that one two-dimensional image is obtained by moving the intersection three-dimensionally. FIG. 5 is a conceptual diagram showing one example illustrative of scan positions and a scan sequence where an intersection is three-dimensionally moved to obtain a two-dimensional image.

In FIG. 5, the direction orthogonal to the sheet indicates the longitudinal direction of the intersection IT. Each of rhombuses in the figure shows a line L' corresponding to each scan position of the intersection IT in the form of a sectional shape of the intersection IT. Numerals in the lines L' show a scan sequence. There is a case where lines L' for a specific scan sequence are designated below by marking the lines L' with numbers indicative of a scan sequence as in the case of a line L' 1 and the like.

In FIG. 5, lines L' are set onto a matrix M' of 4 rows and 14 columns. Described specifically, one line L' is set in each column and a plurality of lines L' smaller than the number of columns are set in each row. And line images based on the scans of the lines L' are collected or gathered thereby to obtain a two-dimensional image IMG of a subject as viewed in a projection direction Dpr parallel to a column direction.

Moving the intersection IT three-dimensionally in this way makes it possible to lengthen a distant scan interval between the lines L' and relax interaction between the lines L' while resolution of the two-dimensional image IMG in the phase direction Dph is being maintained high, as compared with the case in which the intersection is moved at one plane (only one row). An image or three-dimensional image of the subject as seen in the direction other than the projection direction Dpr can also be obtained.

The specific layout of the lines L' and their scan sequence are set in consideration of various circumstances such as relaxing of the interaction between the lines L', uniformization of the interaction between the lines L' over a region of interest of the subject, etc.

In FIG. 5, the lines L' are disposed in such a manner that the line L' at the next row is shifted by one column with respect to the line L' at one row in the right direction as seen from the sheet. A scan is sequentially performed in the column direction (projection direction Dpr) every row. At each row, the scan sequence is set along the rules common between the respective rows.

Thus, the temporal scan interval from the line L' at the first row to the line L' at the second row, and the temporal scan interval from the line L' at the second row to the line L' at the third row are equal to each other. When, for example, the temporal scan interval is expressed in the form of a difference in scan order, the scan interval from a line L' 1 to a line L' 5 is 5−1=4, and the scan interval from the line L' 5 to a line L' 9 is 9−5=4. They are equal to each other.

When, however, attention is focused on a line L' 12, the temporal scan interval (12−9=3) from the line L' 9 to the line L' 12 becomes shorter than the temporal scan interval (9−5=4) from the line L' 5 to the line L' 9. Therefore, a reduction in signal strength due to spin saturation at the line L' 12 becomes greater than that at the line L' 9. Lines L' 13 and L' 14 are also similar to above. Thus, line-like unevenness of luminance occurs at positions corresponding to the lines L' 12, L'13 and L' 14 of the two-dimensional image IMG.

SUMMARY OF THE INVENTION

It is desirable that the problem described previously is solved.

In a magnetic resonance imaging apparatus of one aspect of the invention, a scan for 90°-exciting and 180°-exciting spins of two slices intersecting each other respectively and receiving a spin echo generated from an intersection thereof is repeated while the intersection is sequentially parallel-moved to a plurality of scan positions, thereby to generate, based on the received spin echo, a two-dimensional image at the time that the plural scan positions are seen in a predetermined projection direction orthogonal to the intersection. The plural scan positions are set at a matrix of plural rows and plural columns in which plural positions arranged at first intervals in the direction orthogonal to the intersection and the projection direction are defined as rows, and plural positions arranged at second intervals in the projection direction are defined as columns. A plurality of the scan positions at which a predetermined number of the first intervals are defined as mutual intervals are set in the respective rows of the matrix. One of the scan positions is set to each column of the matrix. The numbers of the plural scan positions in the respective rows are common divisors for the number of the columns in the matrix and set identical to one another between the respective rows.

Preferably, the scan is sequentially performed every row in accordance with an aligning order of the plural rows or the scan is repeatedly performed in sequence in the form of a define number of skips in the direction of arrangement of the plural rows. The plural scan positions in the respective rows are disposed in such a manner that positions relative to plural scan positions at rows at which the preceding scan is performed become identical to one another between the respective rows. A scan sequence within each row obeys common rules between the respective rows.

Preferably, the scan in each row is sequentially performed in accordance with an aligning order of the plural scan positions in each row.

Preferably, the number of the plural scan positions in each row satisfies a condition that the interval between the plural scan positions in each row reaches greater than or equal to twice the maximum thickness of the intersection in the direction of arrangement of the plural scan positions in each row.

Preferably, the number of the plural scan positions in each row is the greatest common divisor of the common divisors for the number of columns in the matrix, which satisfies the condition.

Preferably, the scan is sequentially performed every row with the leading row in the aligning order of the plural rows as a row at which the scan is first performed. Before the scan at the leading row, each of spins on the side of the leading row in the matrix and outside of the matrix is 90°-excited and 180°-excited.

Preferably, the scan is sequentially performed in accordance with the aligning order of the plural rows or repeatedly performed in sequence in the direction of arrangement of the plural rows in the form of a predetermined number of skips. The 90° excitation and 180° excitation to be done before the scan at the leading row are effected on a row at which the scan is first done, assuming that the leading row is a row at which the scan is done secondly.

Preferably, the layout of the plural scan positions and a scan sequence in each row are set in accordance with rules common between the respective rows. Assuming that the leading row is a row at which the scan is performed secondly, the 90° excitation and 180° excitation to be done before the scan at the leading row are effected on plural scan positions set in accordance with the common rules, at a row at which the scan is first done, in a scan sequence that obeys the common rules.

In a magnetic resonance receiving apparatus of another aspect of the invention, the operation of 90°-exciting and 180°-exciting spins of two slices intersecting each other respectively and receiving a spin echo generated from an intersection thereof is repeated while the intersection is sequentially parallel-moved to a plurality of scan positions. The plural scan positions are set at a matrix of plural rows and plural columns in which plural positions arranged at first intervals in the direction orthogonal to the intersection and a projection direction are defined as rows, and plural positions arranged at second intervals in the projection direction are defined as columns. A plurality of the scan positions at which a predetermined number of the first intervals are defined as mutual intervals are set in the respective rows of the matrix. One of the scan positions is set to each column of the matrix. The numbers of the plural scan positions in the respective rows are common divisors for the number of the columns in the matrix and set identical to one another between the respective rows.

A magnetic resonance imaging method of another aspect of the invention repeats the operation of 90°-exciting and 180°-exciting spins of two slices intersecting each other respectively, and the reception of a spin echo generated from an intersection thereof while the intersection is sequentially parallel-moved to a plurality of scan positions, thereby to generate, based on the received spin echo, a two-dimensional image at the time that the plural scan positions are seen in a predetermined projection direction orthogonal to the intersection. The plural scan positions are set at a matrix of plural rows and plural columns in which plural positions arranged at first intervals in the direction orthogonal to the intersection and the projection direction are defined as rows, and plural positions arranged at second intervals in the projection direction are defined as columns. A plurality of the scan positions at which a predetermined number of the first intervals are defined as mutual intervals are set in the respective rows of the matrix. On the scan position is set to each column of the matrix. The numbers of the plural scan positions in the respective rows are common divisors for the number of the columns in the matrix and set identical to one another between the respective rows.

According to the invention, there can be provided a magnetic resonance imaging apparatus, a magnetic resonance receiving apparatus and a magnetic resonance imaging method capable of eliminating variations in signal strength.

Further objects and advantages of the present invention will be apparent from the following description of the preferred embodiments of the invention as illustrated in the accompanying drawings.

DETAILED DESCRIPTION OF THE INVENTION

Figure 1:
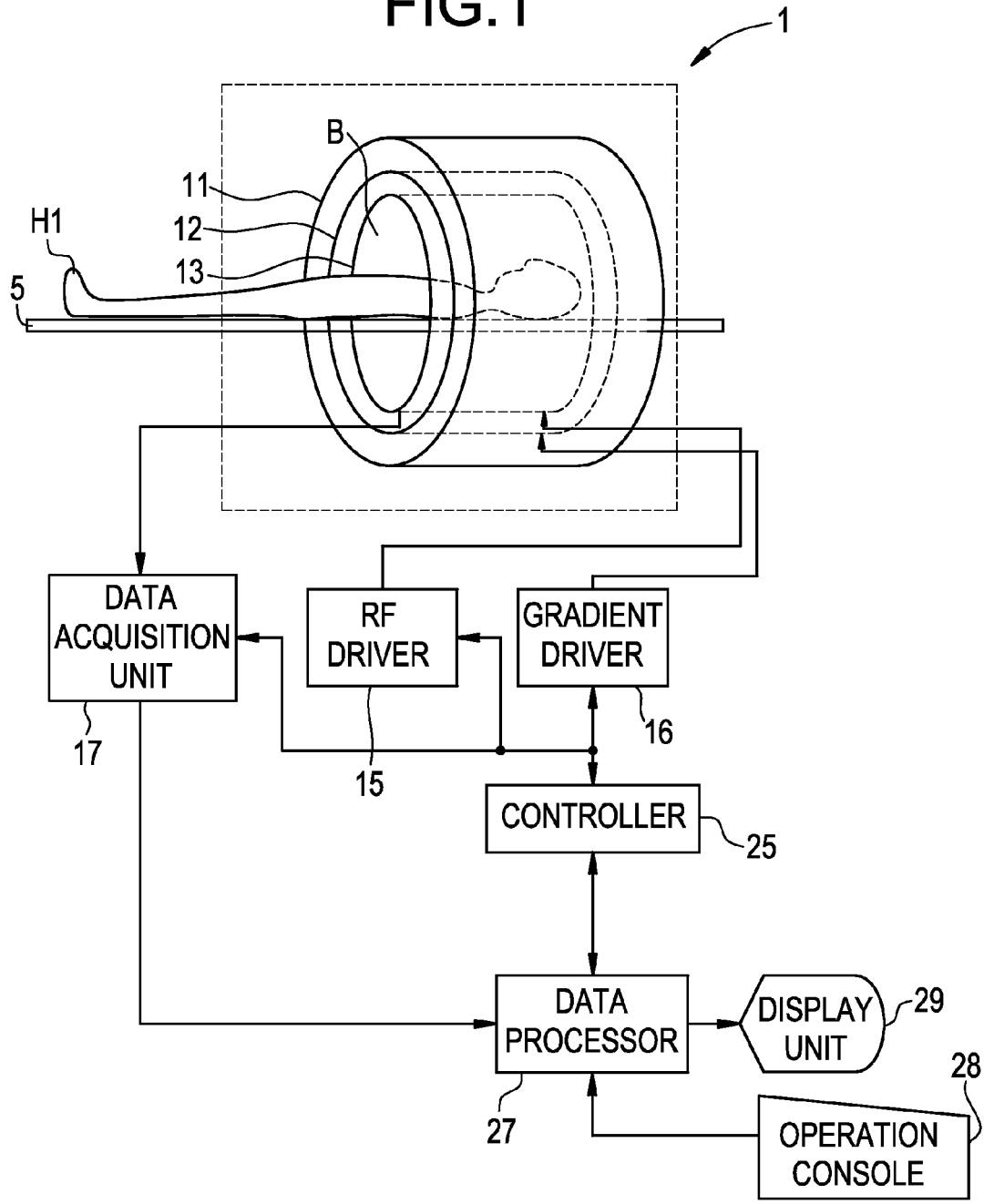
FIG. 1 is a block diagram showing the outline of a construction of a signal processing system of a magnetic resonance imaging apparatus.

FIG. 1 is a block diagram showing a schematic construction of a magnetic resonance imaging apparatus (MRI apparatus) according to the present embodiment. Incidentally, the MRI apparatus 1 is also one example of a magnetic resonance receiving apparatus. The MRI apparatus 1 has a static magnetic field magnet unit 11, a gradient coil unit 12, an RF coil unit or part 13, an RF driver 15, a gradient driver 16, a data acquisition unit 17, a controller 25, a data processor 27, an operation unit or console 28 and a display unit 29.

The static magnetic field magnet unit 11 forms a static magnetic field in an imaging space (bore) B in which a subject H1 is carried by a cradle 5. The static magnetic field magnet unit 11 is constituted of a superconductive magnet, for example. The direction of the static magnetic field is a direction vertical to the direction of a body axis of the subject H1, for example. Incidentally, the static magnetic field magnet unit 11 may be constituted of a pair of permanent magnets.

The gradient coil unit 12 forms gradient magnetic fields in the imaging space B in which the static magnetic field is formed, and adds position information to a magnetic resonance signal received by the RF coil unit 13. The generated gradient magnetic fields are two slice gradient magnetic fields Gs1 and Gs2 and a readout gradient magnetic field Gr. The slice gradient magnetic fields Gs1 and Gs2 have gradients with respect to two slice directions Ds1 and Ds2 (see FIG. 3) orthogonal to each other. The readout gradient magnetic field Gr has a gradient with respect to a frequency direction Dr (see FIG. 3) orthogonal to the slice directions Ds1 and Ds2. Incidentally, the angle at which the slice directions Ds1 and Ds2 intersect each other, may suitably be set and is a right angle, for example.

The RF coil unit 13 transmits an RF pulse corresponding to an electromagnetic wave to the subject H1 in the imaging space B formed with the static magnetic field to form a high frequency magnetic field, thereby exciting the spins of proton in an imaging area of the subject H1. The RF pulse includes, for example, a 90° pulse or a 180° pulse. The RF coil unit 13 receives an electromagnetic wave generated from the excited proton in the subject H1 as a magnetic resonance signal. The received magnetic resonance signal is, for example, a spin echo.

The RF driver 15 drives the RF coil unit 13 based on a control signal outputted from the controller 25 to form a high frequency magnetic field in the imaging space B. The gradient driver 16 drives the gradient coil unit 12 based on the control signal outputted from the controller 25 to generate gradient magnetic fields in the imaging space B. The data acquisition unit 17 acquires the magnetic resonance signal received by the RF coil part 13 based on the control signal sent from the controller 25 and A/D converts the same, and thereafter outputs it to the data processor 27 as digital data.

The controller 25 has a computer and programs for causing the computer to execute the functions of the respective parts so as to correspond to a predetermined pulse sequence. The controller 25 outputs the control signal for executing the predetermined pulse sequence to the RF driver 15, gradient driver 16 and data acquisition unit 17 respectively based on a control signal outputted from the data processor 27 and controls them.

The data processor 27 has a computer and programs for causing the computer to execute predetermined data processing. The data processor 27 outputs the control signal based on an operation signal outputted from the operation console 28 to the controller 25. Further, the data processor 27 obtains data based on the magnetic resonance signal from the data acquisition unit 17 and effects image processing on the obtained data to produce image data of the subject H1, followed by outputting the same to the display unit 29.

The operation console 28 is constituted of operating devices such as a keyboard, a mouse and the like and outputs operation signals corresponding to the operations to the data processor 27. The display unit 29 is constituted of a display device such as a CRT, a liquid crystal display device or the like and displays an image corresponding to the image data outputted from the data processor 27.

Figure 2:
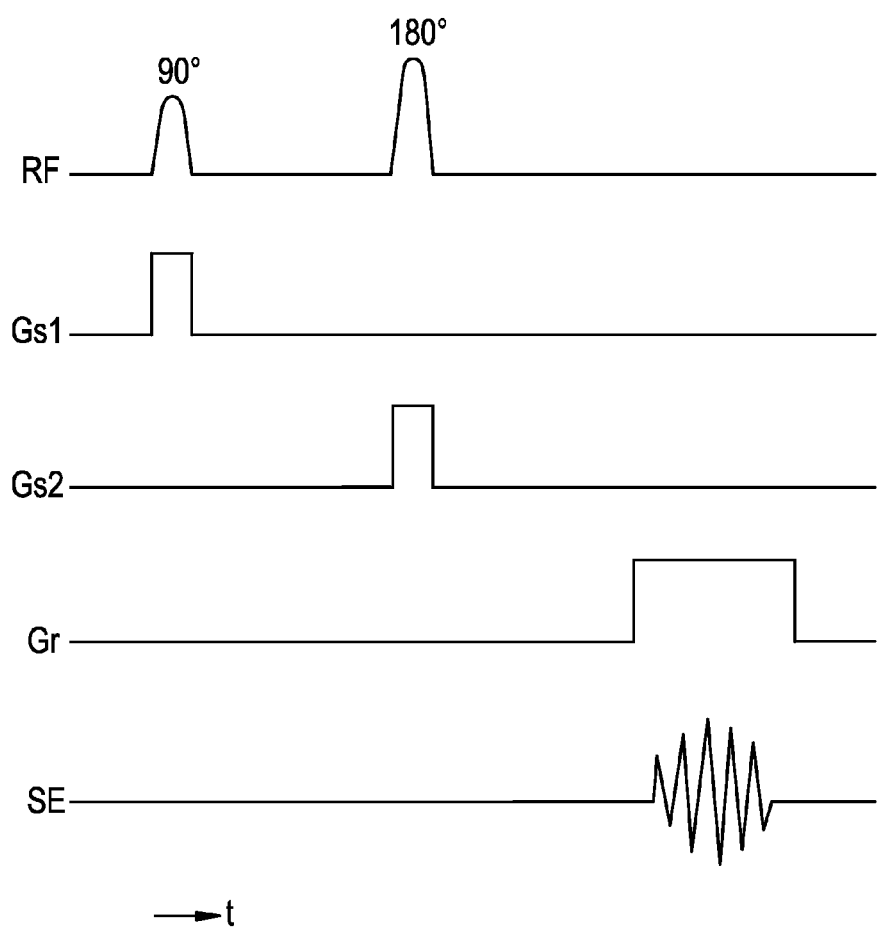
FIG. 2 is a timing chart for describing a line scan executed by the magnetic resonance imaging apparatus shown in FIG. 1.
Figure 3:
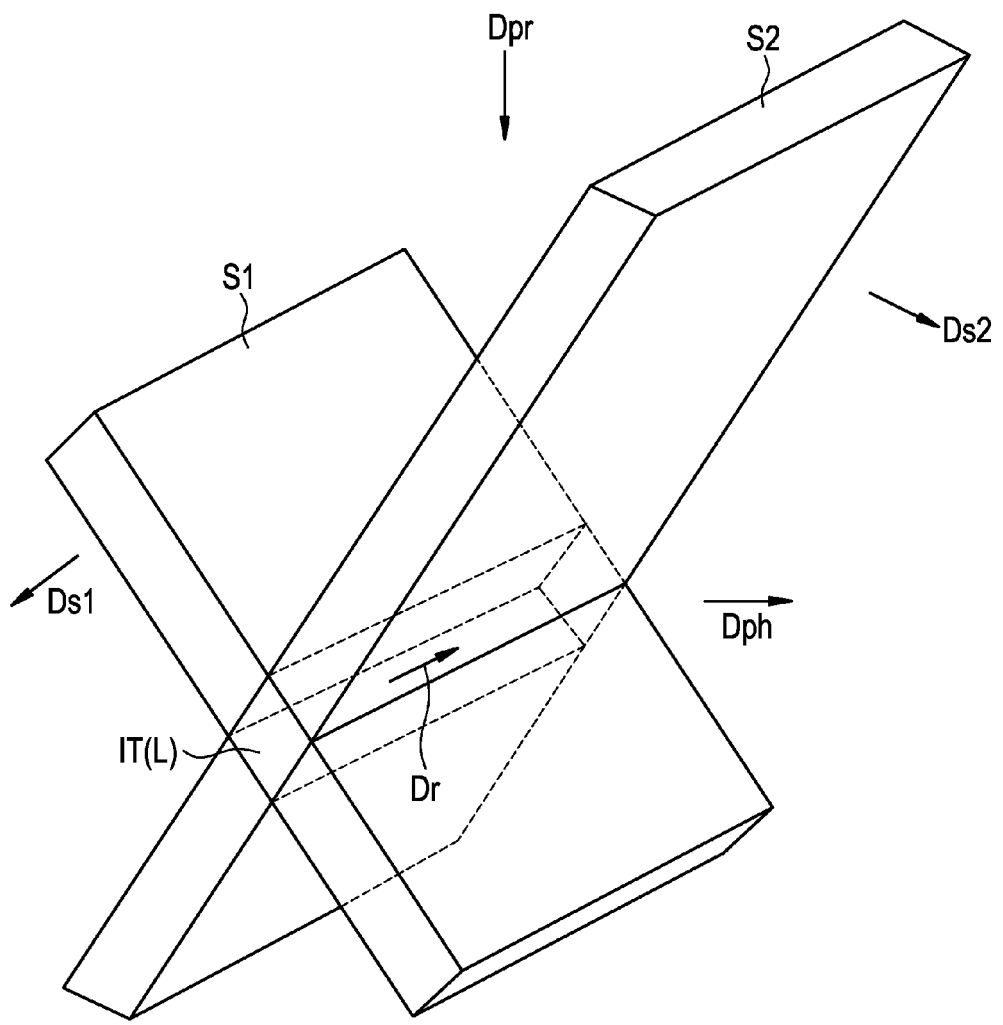
FIG. 3 is a conceptual diagram for describing the line scan executed by the magnetic resonance imaging apparatus shown in FIG. 1.

FIG. 2 is a timing chart for describing a pulse sequence at the execution of a line scan at the MRI apparatus 1. The pulse sequence proceeds along a time base t. A line marked with RF indicates timings for the RF pulse (90° pulse and 180° pulse), lines marked with Gs1 and Gs2 indicate timings for the slice gradient magnetic fields Gs1 and Gs2, a line marked with Gr indicates a timing for the readout gradient magnetic field Gr, and a line marked with SE indicates a timing for the spin echo, respectively. FIG. 3 is a conceptual diagram for describing the line scan.

As shown in FIG. 2, the 90° pulse is first transmitted to the imaging space B and the application of the slice gradient magnetic field Gs1 is performed. At this time, the frequency contained in the bandwidth of the 90° pulse is of a resonance frequency corresponding to part of a range of the strength of the slice gradient magnetic field Gs. Thus, 90° excitation of spins is selectively performed at a slice S1 (see FIG. 3) orthogonal to the slice direction Ds1.

Next, after a predetermined time (TE/2, where TE: echo time) has elapsed from the 90° excitation, the 180° pulse is transmitted to the imaging space B and the application of the slice gradient magnetic field Gs2 is performed. At this time, the frequency contained in the bandwidth of the 180° pulse is of a resonance frequency corresponding to part of a range of the strength of the slice gradient magnetic field Gs2. Thus, 180° excitation of spins is selectively performed at a slice S2 (see FIG. 3) orthogonal to the slice direction Ds2.

As a result, after TE from the 90° excitation, a spin echo occurs at an intersection IT(L) (see FIG. 3) of the slice S1 and the slice S2. At this time, the readout gradient magnetic field Gr is applied to the imaging space B. Thus, the frequency of the spin echo changes in the frequency direction Dr and frequency encoding of the received spin echo by one-dimensional Fourier transformation is enabled.

The pulse sequence shown in FIG. 2 is repeatedly performed while the frequency contained in each of the bandwidths of the 90° pulse and the 180° pulse is being changed, i.e., the position of the intersection IT is being changed. Incidentally, FIG. 2 concisely shows the pulse sequence of the line scan. Dephase or the like may of course be performed with suitable timing.

Figure 4:
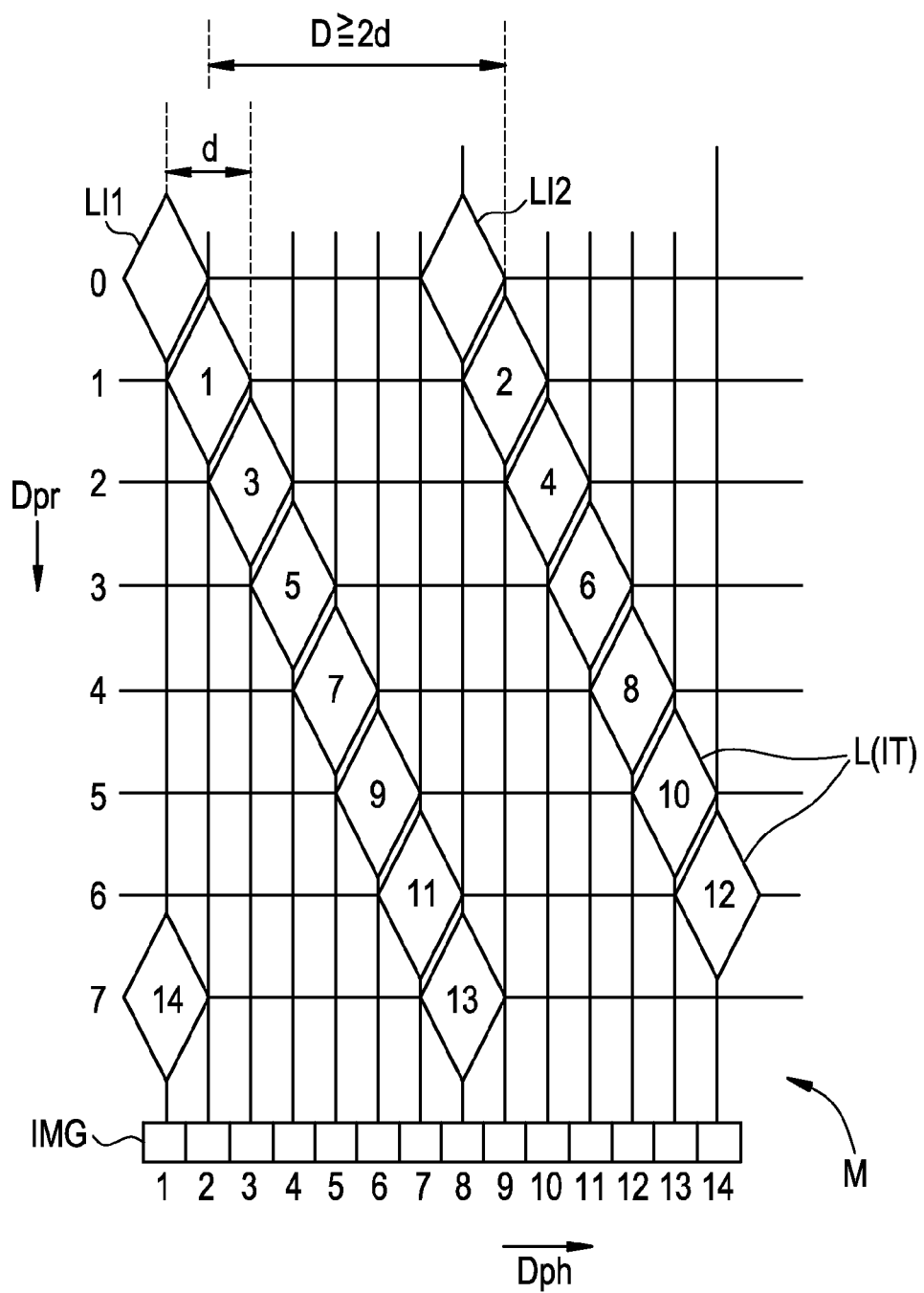
FIG. 4 is a conceptual diagram for describing scan positions and a scan sequence at the line scan executed by the magnetic resonance imaging apparatus shown in FIG. 1.

FIG. 4 is a conceptual diagram showing one example illustrative of scan positions and a scan sequence at the execution of the line scan at the MRI apparatus 1.

In FIG. 4, the direction orthogonal or normal to the sheet indicates the longitudinal direction of the intersection IT. Each of rhombuses shown in the figure shows a line L corresponding to each scan position of the intersection IT in the form of a sectional shape of the intersection IT. Numerals in the lines L show a scan sequence. There is a case where lines L for a specific scan sequence are designated below by marking the lines L with numbers indicative of a scan sequence as in the case of a line L1 and the like.

In FIG. 4, lines L are set onto a matrix M of plural rows and plural columns. Row intervals are identical to one another, and column intervals are identical to one another. Incidentally, FIG. 4 shows a matrix M of 7 row and 14 columns for convenience to intelligibly describe scan positions and a scan sequence employed in the present embodiment. In fact, the number of rows and the number of columns may suitably be set according to resolution or the like of a required phase direction Dph. For example, the number of rows is 126 and the number of columns is 126.

One line L is set in each column. In the respective rows, a plurality of lines L smaller than the number of columns are set at predetermined intervals (intervals corresponding to a predetermined number of column intervals). By collecting or gathering line images based on scans of lines L, a two-dimensional image IMG of the subject as seen in a projection direction Dpr parallel to the column direction is obtained.

The lines L are laid out in such a manner that lines L lying in the next row are shifted by one column in a phase direction Dph with respect to lines L lying in one row. However, when the position shifted by one column in the phase direction Dph fall outside the range of the matrix M as in the case of a line L14, the line is returned to the first column as viewed in the phase direction Dph. Scans are carried out sequentially every row. The scans for every row are sequentially performed in the projection direction Dpr (this may be its opposite direction) in accordance with the sequence of arrangement of rows. In the respective rows, the scan sequence is set along the rules common between the respective rows.

In FIG. 4, the numbers of the lines L at the respective rows are set to the common divisor or factor (except for 1 and the number of columns per se) of the number of columns and made identical to one another. Thus, the aforementioned problem of shortening the temporal scan interval from each of the lines L' corresponding to the third row of FIG. 5 to each of the lines L' corresponding to the fourth row as compared with the temporal scan interval from each of the lines L' corresponding to the first row to each of the lines L' corresponding to the second row is solved. Described specifically, it is as follows.

Figure 5:
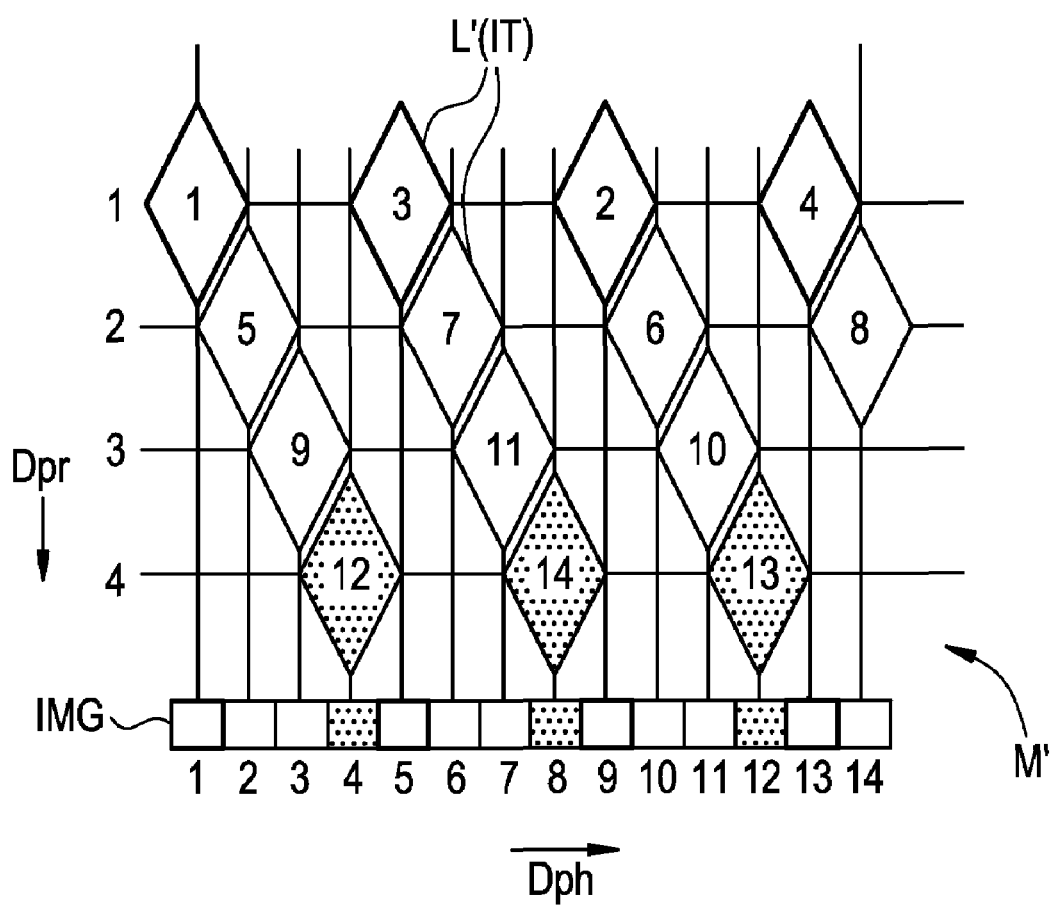
FIG. 5 is a conceptual diagram for describing scan positions and a scan sequence at a line scan of a comparative example.

When, as shown in FIG. 5, the layout interval between the lines L' at the respective rows is set as an m columns and one line L' is set at each column, the required number of rows is m. Of the m rows, the rows identical in number to the remainder obtained by dividing the number of columns by m, include lines L' identical in number to a quotient +1 obtained by dividing the number of columns by m, and the remaining rows include lines L' identical in number to a quotient obtained by dividing the number of columns by m. In the example shown in FIG. 5, m=4, the quotient obtained by dividing the number of columns 14 by 4 is 3 and the remainder is 2. Therefore, the two rows of the four rows include lines L' equal to 3+1=4, and the remaining two rows include three lines L'.

The four lines L' are disposed at the first and second rows respectively, whereas only the three lines L' are disposed at the third row. Thus, the time interval taken from the start of a scan for the third row to the transition to a scan for the fourth row becomes shorter than the time interval taken from the start of a scan for the first row to the transition to a scan for the second row. As a result, a scan interval (e.g., time interval taken from the line L' 9 to the line L' 12) from the line L' to its adjoining line L' of the next row becomes shorter.

Since, however, the number of the lines L' is defined depending on the size and resolution in the phase direction Dph, which are required at an image IMG, it is inadvisable to decrease the number of the lines L' corresponding to the first and second rows and increase the number of the lines L' corresponding to the third row. If, for example, the line L' 4 and the line L' 8 are omitted, then the image IMG is reduced as viewed in the phase direction Dph. If the lines L' are added to the third row, then the scan is done while they overlap with any line L' of other rows as viewed in the projection direction Dpr. If a waiting time is provided between the end of the scan for the third row (scan for the line L' 11) and the start of the scan for the fourth row (scan for the line L' 12) and temporal scan intervals are uniformized, then the entire scan interval becomes long.

Thus, in the present embodiment, the numbers of the lines L at the respective rows are set to the common divisor or factor (2 in FIG. 4) for the number of columns as shown in FIG. 4, thereby making it possible to make the numbers of the lines L at the respective rows identical to one another. Accordingly, the time taken from the start of the scan for one row to the transition to the scan for the next row can be made uniform over all rows even though the waiting time is not provided.

The common divisor for the number of columns in the matrix M exists in plural form. Since the number of the columns is 14 in FIG. 4, for example, two of 2 and 7 exist as the common divisors. If a relatively large common divisor is selected, then the number of rows becomes reduced. It is therefore possible to narrow a scan range in the projection direction Dpr and thereby improve the accuracy of a tomographic image of the subject H1 as viewed in the projection direction Dpr. If a relatively small common divisor is selected, then the number of the rows increases and by extension, the scan range in the projection direction Dpr becomes wide. Therefore, it becomes easy to collect information over a wide range of the subject H1, obtain tomographic images of the subject H1 as viewed from the direction other than the projection direction Dpr and obtain a three-dimensional image of the subject H1. Thus, the number of the lines L at each row may suitably be selected from the plural common divisors according to the purposes.

When, however, the relatively large common divisor is selected, the distant scan interval between the lines L within each row becomes shorter and spin saturation is easy to occur due to interaction between the lines L. Therefore, the common divisor may preferably be selected in such a manner that the distance D (center distance between the rhombuses in FIG. 4) between the lines L becomes greater than or equal to twice the maximum thickness d (diagonal length of each rhombus in FIG. 4) of the intersection IT. Thus, when, for example, the scan range as viewed in the projection direction Dpr is made as narrow as possible, the greatest common divisor that satisfies the condition that the distance D is the maximum thickness d×2 or greater, is selected from the plural common divisors.

The scan sequences at the respective rows are sequentially set in, for example, the phase direction Dph (it may be the opposite direction) in accordance with the aligning order of the lines L. In this case, the temporal scan interval between the lines L at each row is also made uniform as well as the temporal time interval between the lines L at the rows different from each other. That is, as shown in FIG. 5, the temporal scan intervals are uniformized as compared with the case in which the direction of the scan sequence changes between the phase direction Dph and its opposite direction.

The lines L subsequent to the second row are affected by the lines L excited before it, particularly, the lines L of the immediately preceding row, whereas the lines L at the first row are not affected by the lines L at other rows. Thus, the signal strength of each line L at the first row becomes easy to increase as compared with other rows. Therefore, the periphery of each line L at the first row is excited in advance and thereby variations in signal strength are uniformized. Described specifically, it is as follows.

In FIG. 4, lines L11 and L12 (hereinafter called simply lines "L1" and the two might not be distinguished from each other) indicate the positions to be excited in advance. The lines L1 are disposed on the side (0th row) opposite to the second row with respect to the lines L at the first row. In other words, the lines L1 are placed on the first-row side of the matrix M and its outside. Described more specifically, when assuming that the lines L1 and L2 corresponding to the first row at which the reception of the spin echo is first done when the lines L (lines at which the reception of the spin echo and the generation of each line image are done and which are available in the generation of a two-dimensional image) are being arranged in accordance with the rules common between the respective rows, belong to the row (second row) at which the reception of the spin echo is done secondly, the lines L1 are disposed at plural scan positions at the row at which the reception of the spin echo is first done. In the example of FIG. 4, for example, the lines L11 and L12 are disposed at the positions shifted by one row on the side opposite to the phase direction Dph with respect to the lines L1 and L2.

The exciting order of the lines L11 and L12 and its time interval are set in accordance with the rules similar to the scan sequences of the first row and later. That is, since the lines L are scanned in the phase direction Dph in accordance with their aligning order in the example of FIG. 4, the lines L1 are also excited in the phase direction Dph in accordance with the aligning order, and the time interval between the lines L11 and L12 is equal to the time interval between the lines L1 and L2. Further, the time interval necessary for the transition from the 0th row to the first row is also equal to the time interval taken for the transition to the next row at the rows subsequent to the first row. That is, the time interval taken from the end of the excitation of the line L12 to the start of the scan for the line L1 is equivalent to the time interval from the end of the scan for the line L2 to the start of the scan for the line L3.

A pulse sequence for the line L1 is similar to that shown in FIG. 2. That is, the application of the 90° pulse, 180° pulse, slice gradient magnetic fields Gs1 and Gs2, readout gradient magnetic field Gr and the like is performed. However, the reception of a spin echo generated at each line L1 is not carried out. Even though the reception of the spin echo is done, a line image based on the received spin echo is not produced. Alternatively, even though the line image is produced, it is not incorporated in the final image IMG. However, the spin echo from each line L1 may suitably be used by, for example, calculating some offset values or correction values for the image IMG, based on the reception of each spin echo.

According to the above embodiment, in the line scan executed by the MRI apparatus 1, the numbers of plural lines L (scan positions) at the respective rows are given as the common divisor for the number of columns in the matrix M and set identical to each other between the respective rows. Therefore, the time intervals necessary for scanning at the respective rows can be uniformized. It is thus possible to uniformize the temporal scan intervals and reduce variations in the signal strength caused by a reduction in the signal strength due to the spin saturation.

Particularly when the scan is sequentially performed every row in accordance with the aligning order of the rows, the lines L at the respective rows are disposed in such a manner that the relative positions with respect to the lines L of the immediately preceding row become identical to one another between the respective rows, and the scan sequence at each row complies with the common rules between the respective rows, the temporal scan intervals between the plural lines L at the respective rows and the plural lines L at the row located immediately before the same become identical to one another between the plural rows, and hence the effect of reducing the variations in the signal strength is great.

Further, when the scan sequences at the respective rows are sequentially set in accordance with the aligning order of the lines L in the rows, the temporal scan intervals can be uniformized even at the respective rows, and the variations in the signal strength can further be reduced.

At each row, the distance D (distant scan interval) between the lines L is determined by the size of the matrix M, the number of columns and the common divisor for the number of columns selected as the number of the lines L at each row. However, the reduction in the signal strength due to the spin saturation can be prevented by selecting the number of the lines L at each row from the plural common divisors in such a manner that the distance D reaches greater than or equal to twice the maximum thickness d of the intersection IT.

Particularly when the greatest common divisor at which the distance D becomes greater than or equal to twice the maximum thickness d is selected from the common divisors for the number of columns, the scan range in the projection direction Dpr is narrowed to make it possible to obtain a high-accuracy tomographic image.

Exciting the outer periphery of the matrix before the scan for the first row at which the scan is first done makes it possible to prevent the signal strength from being enhanced only at the first row. By exciting the layout positions of the lines corresponding to the first row (0th row) assuming that the first row is of the second row in particular, the variations in the signal strength can be further uniformized.

The invention is not limited to the above embodiment, and various forms can be carried out.

The scan sequence in the column direction (projection direction) at the scan for every row may suitably be set and is not limited to one that obeys the aligning order of the rows. Likewise, the scan sequence in the row direction (direction orthogonal to the projection direction), of the plural scan positions (lines) within each row may suitably be set and is not limited to one that obeys the aligning order of the scan positions lying within each row. The scan positions at each row may suitably be set and are not limited to the scan positions at which the relative positions with respect to the immediately preceding row or adjoining row become identical to one another between the respective rows. If the number of the scan positions at each row is given as the common divisor for the number of columns even though these scan sequences and scan positions are suitably set, then the time intervals necessary for the scanning of the respective rows become identical to one another, and the temporal scan intervals can easily be uniformized between the respective rows.

Figure 6:
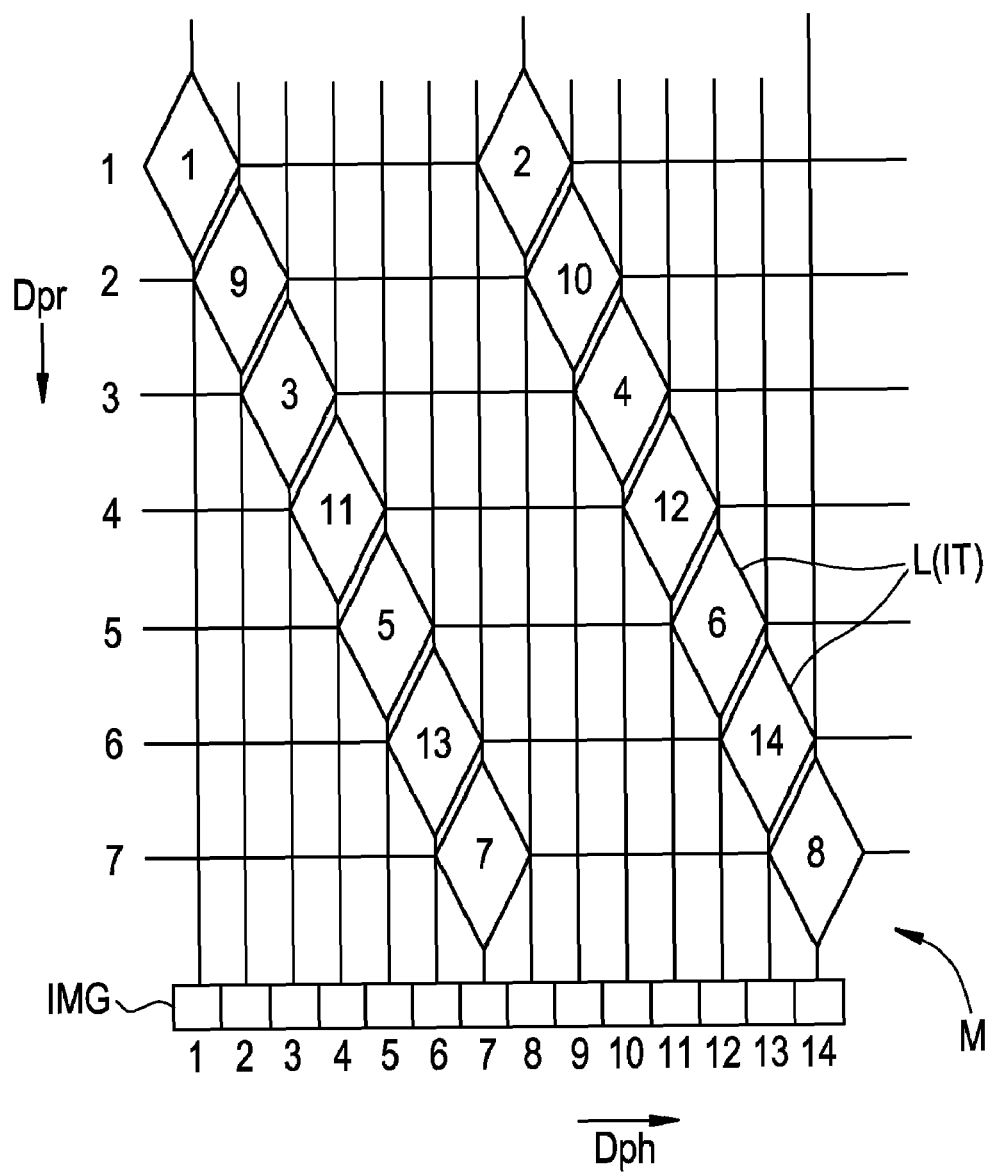
FIG. 6 is a conceptual diagram for describing a modification of a scan sequence at a line scan.

As shown in FIG. 6 by way of example, a scan sequence in a column direction at a scan executed for each row is set based on a n-row skip (one-row skip illustrated in FIG. 6) as viewed in the column direction (or its opposite direction) to sequentially perform scans every row. Thereafter, the scans every row may be repeated in sequence in the column direction again on an n-row skip basis with the skipped row as the object. That is, the sequential execution of the scans every row in the column direction (or its opposite direction) on the n-row skip basis may be repeated n times while the intended rows are being shifted one by one. In this case, the greater the number of columns, the longer the temporal scan interval between an ith time and an i+1th time (i, i+1<n). Further, the distance between the respective rows at which scans are performed at the ith time is made long by n rows.

Incidentally, the temporal scan interval (e.g., temporal scan interval between a fifth row and a seventh row) with respect to the rows spaced away by n rows (one row in FIG. 6) effects a large influence on the spin saturation. In other words, the influence from the scan positions corresponding to the adjoining n rows can be relaxed. On the other hand, when the layout interval between the scan positions (lines L) at each row is set to the m columns as described above, there is a difference in the number of the scan positions between the rows of m rows identical in number to the remainder obtained by dividing the number of columns by m and the remaining rows thereof. Since the remainder is m−1 at maximum, the rows identical in number to the remainder cannot be skipped even by the n-row skip when n<m−1. It can thus be said that the effect of selecting the common divisor is large.

As to the scan sequence at each row in the row direction, the scan is sequentially performed on a k-column skip (one-column skip illustrated in FIG. 5) basis in the row direction (or its opposite direction) as shown in FIG. 5. Thereafter, the scan may be repeated in sequence on the k-column skip basis in the row direction again with each skipped column as the target. That is, the sequential execution of the scan on the k-column skip basis in the row direction (or its opposite direction) may be repeated p times while the intended columns are being shifted one by one. Incidentally, the scan positions and scan sequence shown in FIG. 5 also show one example illustrative of the scan positions and scan sequence that obeys the rules mutually common between the respective rows. If the common divisor for the number of columns is selected as the number of the scan positions at each row, then the time intervals between the scan positions adjacent to one another become identical to each other, and hence the effect of selecting the common divisor is great as compared with the case in which they do not obey the rules mutually common between the respective rows.

Many widely different embodiments of the invention may be configured without departing from the spirit and the scope of the present invention. It should be understood that the present invention is not limited to the specific embodiments described in the specification, except as defined in the appended claims.

The invention claimed is:

1. A magnetic resonance imaging apparatus comprising:
a radio frequency (RF) coil unit configured to transmit a 90° pulse and a 180° pulse in which a scan for 90°-exciting and 180°-exciting spins of two slices intersect each other, said RF coil unit further configured to receive a spin echo generated from the intersection thereof;
a controller configured to sequentially parallel move the intersection to a plurality of scan positions;
a display device; and
a processor programmed to:
generate, based on the received spin echo, a two-dimensional image at the time that the plural scan positions are seen in a predetermined projection direction orthogonal to the intersection;
set the plurality of scan positions at a matrix of plural rows and plural columns in which a plurality of positions arranged at first intervals in the direction orthogonal to the intersection and the projection direction are defined as rows, and a plurality of positions arranged at second intervals in the projection direction are defined as columns;
set a plurality of the scan positions at which a predetermined number of the first intervals are defined as mutual intervals in respective rows of a matrix;
set one of the plurality of scan positions to each column of the matrix; and
set the number of the plurality of scan positions in the respective rows identical to one another between the respective rows, the number of the plurality of scan positions in the respective rows being common divisors for the number of the columns in the matrix.

2. The magnetic resonance imaging apparatus according to claim 1, wherein:
the scan is sequentially performed for every row in accordance with an aligning order of the plurality of rows or the scan is repeatedly performed in sequence in a form of a define number of skips in a direction of arrangement of the plurality of rows;
the plurality of scan positions in the respective rows are disposed in such a manner that positions relative to a plurality of scan positions at rows at which the preceding scan is performed become identical to one another between the respective rows; and
a scan sequence within each row obeys common rules between the respective rows.

3. The magnetic resonance imaging apparatus according to claim 2, wherein the scan in each row is sequentially performed in accordance with an aligning order of the plurality of scan positions in each row.

4. The magnetic resonance imaging apparatus according to claim 3, wherein the number of the plurality of scan positions in each row satisfies a condition that an interval between the plurality of scan positions in each row reaches greater than or equal to twice a maximum thickness of the intersection in the direction of arrangement of the plurality of scan positions in each row.

5. The magnetic resonance imaging apparatus according to claim 4, wherein the number of the plurality of scan positions in each row is a greatest common divisor of the common divisors for the number of columns in the matrix, which satisfies the condition.

6. The magnetic resonance imaging apparatus according to claim 1, wherein:
the scan is sequentially performed for every row with a leading row in an aligning order of the plurality of rows as a row at which the scan is first performed; and
before the scan at the leading row, each spin on a side of the leading row in a matrix and outside of the matrix is 90°-excited and 180°-excited.

7. The magnetic resonance imaging apparatus according to claim 2, wherein:
the scan is sequentially performed for every row with a leading row in an aligning order of the plurality of rows as a row at which the scan is first performed; and
before the scan at the leading row, each spin on a side of the leading row in a matrix and outside of the matrix is 90°-excited and 180°-excited.

8. The magnetic resonance imaging apparatus according to claim 3, wherein:
the scan is sequentially performed for every row with a leading row in an aligning order of the plurality of rows as a row at which the scan is first performed; and
before the scan at the leading row, each spin on a side of the leading row in a matrix and outside of the matrix is 90°-excited and 180°-excited.

9. The magnetic resonance imaging apparatus according to claim 6, wherein:
the scan is sequentially performed in accordance with the aligning order of the plurality of rows or repeatedly performed in sequence in the direction of arrangement of the plurality of rows in a form of a predetermined number of skips; and
the 90° excitation and 180° excitation are done before the scan at the leading row is effected on a row at which the scan is first done, assuming that the leading row is a row at which the scan is done secondly.

10. The magnetic resonance imaging apparatus according to claim 9, wherein:
a layout of the plurality of scan positions and a scan sequence in each row are set in accordance with rules common between the respective rows; and
assuming that the leading row is a row at which the scan is performed secondly, the 90° excitation and 180° excitation are to be done before the scan at the leading row is effected on the plurality of scan positions set in accordance with the common rules, at a row at which the scan is first done, in a scan sequence that obeys the common rules.

11. A magnetic resonance imaging method comprising:
90°-exciting and 180°-exciting spins of two slices intersecting each others, respectively;
receiving a spin echo generated from the intersection thereof;
sequentially parallel-moving the intersection to a plurality of scan positions;
setting the plurality of scan positions, via a processor, at a matrix of a plurality rows and a plurality columns in which a plurality of positions arranged at first intervals in a direction orthogonal to the intersection and a projection direction are defined as rows, and a plurality of positions arranged at second intervals in the projection direction are defined as columns;

setting a plurality of the scan positions at which a predetermined number of the first intervals are defined as mutual intervals, via the processor, in respective rows of the matrix;

setting one of the scan positions, via the processor, to each column of the matrix;

setting the number of the plurality of scan positions in the respective rows identical to one another between the respective rows, the number of the plurality of scan positions in the respective rows being common divisors for the number of the columns in the matrix;

generating, via the processor, based on the received spin echo, a two-dimensional image on a display device at the time that the plural scan positions are seen in a predetermined projection direction orthogonal to the intersection; and displaying, on a display device, the two-dimensional image.

12. The magnetic resonance imaging method according to claim 11, wherein:

a scan for the operation is sequentially performed for every row in accordance with an aligning order of the plurality of rows or the scan is repeatedly performed in sequence in a form of a defined number of skips in a direction of arrangement of the plurality of rows;

the plurality of scan positions in the respective rows are disposed in such a manner that positions relative to a plurality of scan positions at rows at which the preceding scan is performed become identical to one another between the respective rows; and a scan sequence within each row obeys common rules between the respective rows.

13. The magnetic resonance imaging method according to claim 12, wherein the scan in each row is sequentially performed in accordance with an aligning order of the plurality of scan positions in each row.

14. The magnetic resonance imaging method according to claim 13, wherein the number of the plurality of scan positions in each row satisfies a condition that an interval between the plurality of scan positions in each row reaches greater than or equal to twice a maximum thickness of the intersection in the direction of arrangement of the plurality of scan positions in each row.

15. The magnetic resonance imaging method according to claim 14, wherein the number of the plurality of scan positions in each row is a greatest common divisor of the common divisors for the number of columns in the matrix, which satisfies the condition.

16. The magnetic resonance imaging method according to claim 11, wherein:

the scan is sequentially performed for every row with a leading row in an aligning order of the plurality of rows as a row at which the scan is first performed; and before the scan at the leading row, each spin on a side of the leading row in a matrix and outside of the matrix is 90°-excited and 180°-excited.

17. The magnetic resonance imaging method according to claim 12, wherein:

the scan is sequentially performed for every row with a leading row in an aligning order of the plurality of rows as a row at which the scan is first performed; and before the scan at the leading row, each spin on a side of the leading row in a matrix and outside of the matrix is 90°-excited and 180°-excited.

18. The magnetic resonance imaging method according to claim 13, wherein:

the scan is sequentially performed for every row with a leading row in an aligning order of the plurality of rows as a row at which the scan is first performed; and before the scan at the leading row, each spin on a side of the leading row in a matrix and outside of the matrix is 90°-excited and 180°-excited.

19. The magnetic resonance imaging method according to claim 16, wherein:

the scan is sequentially performed in accordance with the aligning order of the plurality of rows or repeatedly performed in sequence in the direction of arrangement of the plurality of rows in a form of a predetermined number of skips; and the 90°excitation and 180°excitation are done before the scan at the leading row is effected on a row at which the scan is first done, assuming that the leading row is a row at which the scan is done secondly.

20. The magnetic resonance imaging method according to claim 19, wherein:

a layout of the plurality of scan positions and a scan sequence in each row are set in accordance with rules common between the respective rows; and assuming that the leading row is a row at which the scan is performed secondly, the 90°excitation and 180°excitation are done before the scan at the leading row is effected on the plurality of scan positions set in accordance with the common rules, at a row at which the scan is first done, in a scan sequence that obeys the common rules.

* * * * *